United States Patent
Bravo Vasquez et al.

(10) Patent No.: US 6,777,036 B2
(45) Date of Patent: Aug. 17, 2004

(54) METHOD FOR THE DEPOSITION OF MATERIALS FROM MESOMORPHOUS FILMS

(75) Inventors: Juan Pablo Bravo Vasquez, Burnaby (CA); Ross H. Hill, Coquitlan (CA)

(73) Assignee: Simon Fraser University, Burnaby (CA)

( * ) Notice: Subject to any disclaimer, the term of this patent is extended or adjusted under 35 U.S.C. 154(b) by 56 days.

(21) Appl. No.: 09/876,944

(22) Filed: Jun. 8, 2001

(65) Prior Publication Data

US 2002/0197415 A1 Dec. 26, 2002

Related U.S. Application Data

(63) Continuation-in-part of application No. 09/875,957, filed on Jun. 6, 2001, now abandoned.

(51) Int. Cl.$^7$ ............................................. B05D 3/06
(52) U.S. Cl. ........................ 427/533; 427/552; 427/553; 427/555
(58) Field of Search ................ 427/533, 551, 427/552, 553, 554, 555, 556, 581, 584, 582, 583

(56) References Cited

U.S. PATENT DOCUMENTS

| | | | |
|---|---|---|---|
| 4,199,649 A | * | 4/1980 | Yundt .......................... 427/555 |
| 4,952,556 A | | 8/1990 | Mantese et al. ............... 505/1 |

(List continued on next page.)

FOREIGN PATENT DOCUMENTS

| | | |
|---|---|---|
| DE | 42 10 400 C1 | 1/1993 |
| EP | 0 414 140 A2 | 2/1991 |
| EP | 0 414 140 A2 A3 | 2/1991 |
| EP | 0 670 055 B1 | 9/1995 |
| EP | 0 687 136 A1 | 12/1995 |
| JP | 05070960 A * | 3/1993 |
| JP | 9-41159 | 2/1997 |
| JP | 11-119431 | 4/1999 |
| WO | WO 90/02827 | 3/1990 |
| WO | WO 94/11787 | 5/1994 |

OTHER PUBLICATIONS

M. A. S Aquino, "Diruthenium and Diosmium Tetracarboxylates: Synthesis, Physical Properties and Applications," *Coord. Chem. Rev.*, 170:141–202 (1998), no month.

A. A. Avey and R. H. Hill, "Solid State Photochemistry of $Cu_2(OH_2)_2(O_2C(CH_2)_4CH_3)_4$ in Thin Films: The Photochemical Formation of High–Quality Films of Copper and Copper(I) Oxide. Demonstration of a Novel Lithographic Technique for the Patterning of Copper," *J. Am. Chem. Soc.*, 118–1:237–238 (1996), no month.

(List continued on next page.)

*Primary Examiner*—Marianne Padgett
(74) *Attorney, Agent, or Firm*—Morgan, Lewis & Bockius LLP

(57) ABSTRACT

A photoresist-free method for making patterned films of metal oxides, metals, or other metal containing compounds is described. The method involves applying a thin film coating of a metal complex, resulting in the formation of a liquid crystal film. This film can be photolyzed resulting in a chemical reaction which deposits a metal or metal oxide film. The metal complex used is photoreactive and undergoes a chemical reaction in the presence of light of a suitable wavelength. The end product of the reactions depends upon the atmosphere in which the reactions take place. Metal oxide films may be made in air. Patterned films may be made by exposing only selected portions of the film to light. Patterns of two or more materials may be laid down from the same film by exposing different parts of the film to light in different atmospheres.

42 Claims, 5 Drawing Sheets

U.S. PATENT DOCUMENTS

| | | | | |
|---|---|---|---|---|
| 5,064,685 | A | | 11/1991 | Kestenbaum et al. ....... 427/53.1 |
| 5,176,744 | A | | 1/1993 | Muller ....................... 106/1.26 |
| 5,277,980 | A | | 1/1994 | Mino .......................... 428/403 |
| 5,348,775 | A | * | 9/1994 | Lin ............................ 427/555 |
| 5,508,068 | A | * | 4/1996 | Nakano .......................... 428/1 |
| 5,512,162 | A | * | 4/1996 | Sachs ......................... 427/581 |
| 5,534,312 | A | | 7/1996 | Hill et al. ...................... 47/533 |
| 5,630,872 | A | | 5/1997 | Ogi et al. .............. 106/287.18 |
| 5,696,384 | A | | 12/1997 | Ogi et al. .............. 252/182.12 |
| 5,821,017 | A | | 10/1998 | Thomson et al. ............... 430/9 |
| 6,071,676 | A | | 6/2000 | Thomson et al. ........... 430/311 |
| 6,126,855 | A | | 10/2000 | Elliott ................... 252/299.01 |
| 6,200,646 | B1 | * | 3/2001 | Neckers et al. ............. 427/555 |
| 6,207,240 | B1 | * | 3/2001 | Schoenfeld et al. ........ 427/555 |
| 6,348,239 | B1 | * | 2/2002 | Hill et al. ................... 427/533 |
| 6,458,431 | B2 | * | 10/2002 | Hill et al. ................... 427/533 |
| 6,576,302 | B1 | * | 6/2003 | Mizuta et al. .............. 427/596 |
| 6,645,571 | B1 | * | 11/2003 | Takai et al. ................. 427/553 |
| 6,696,363 | B2 | * | 2/2004 | Lee et al. ................... 438/681 |
| 2002/0090565 | A1 | * | 7/2002 | Griffith et al. .............. 427/554 |

OTHER PUBLICATIONS

A. Beclaska, R. J. Batchelor, F. W. B. Einstein, R. H. Hill, and B. J. Palmer, "Solid–State Photochemistry and Structure of trans–$(Et_3P)_2Ni(N_3)_2$: Photodeposition of Nickel," *Inorg. Chem.*, 31–14:3118–3123 (1992), no month.

D. G. Bickley, R. H. Hill, and C. I. Horvath, "Solid State Photochemistry of $(C_8H_{12})Pt(N_3)_2$ as Thin Films on Si(111) Surfaces," *J. Photochem. Photobiol. A: Chem*, 67:181–186 (1992), no month.

S. L. Blair, "Photochemical Deposition of Metal and Metal Oxide Films From Amorphous films of Inorganic Precursors," Ph.D. thesis, Simon Fraser University (1996), Dec.

S. L. Blair, J. Hutchins, R. H. Hill, and D. G. Bickley, "Solid–State Photochemistry of Platinum(II) Methylazide Complexes as Thin Films on Si(111) Surfaces: Photolithography of Platinum Films," *J. Materials Sci.*, 9:2143–2146 (1994), no month.

S. L. Blair, W. Xia, and R. H. Hill, "The Photochemical Production of Nickel Films From Thin Films of the Inorganic Nickel Complexes trans–$NiN_4X_2$ ($N_2$=$Et_2NC_2H_4NH_2$, $MeHNC_2HMeH$; X=$NO_2$, $NO_3$, NCS)," *J. Photochem. Photobiol. A: Chem.*, 91:183–191 (1994), no month.

J. P. Bravo–Vasquez and R. H. Hill, "The Photolithographic Deposition of Nanostructured Materials," *Polymeric Materials Sci. and Eng.*, 81:16–17 (1999), no month.

C. W. Chu and R. H. Hill, "Solid State Photochemistry of Thin Films of Cr, Mo and W Organometallic Complexes as Thin Films on Silicon Substrates," Materials Research Society–Taiwan, *IUMRS–ICEM'94 Symp. Proc.*, vol. 1, 441–446 (1994), no month.

L. B. Goetting, B. J. Palmer, M. Gao, and R. H. Hill, "Photoresist–Free Lithography of 3 $\mu m$ Wide $UO_3$ Lines From Amorphous Films of Uranyl Complexes," *J. Materials Science*, 29:6147–6151 (1994), no month.

R. H. Hill, A. A. Avey, S. L. Blair, M. Gao, and B. J. Palmer, "Molecular Design for Photo and Electron Beam Lithography With Thin Films of Coordination Compounds," *Materials Chemistry and Physics*, 43:233–237 (1996), no month.

R. H. Hill, A. A. Avey, S. L. Blair, M. Gao, and B. J. Palmer, "Photo and Electron Beam Lithography With Coordination Compounds," *IUMRS_ICEM '94 Symp. Proc.*, 1:435–440 (1994), no month.

T. W. H. Ho, S. L. Blair, and R. H. Hill, "Solid State Photochemistry of $(C_2H_4(Ph_2P)M(N_3)_2$ (M=Ni, Pd, Pt) on Si(111) Surfaces," *J. Photochem. Photobiol. A: Chem.*, 69:229–235 (1992), no month.

M. Ibn–Elha, D. Guillion, A. Skoulios, A. M. Giroud–Godquin, and P. Maldivi, "Structural Study of Crystalline and Columnar Copper (II) Soaps," *Liquid Crystals*, 11–5:731–744 (1992), no month.

B. J. Palmer, A. Becalska, T. W. H. Ho, and R. H. Hill, "Photolithography of Amorphous Films of $(\eta^5-C_5H_5)_2Ti(N_3)_2$ on Silicon (111) Resulting in $TiO_2$: The Mechanism of the Photodeposition Reaction," *J. Materials Science*, 28:6013–6020 (1993), no month.

B. J. Palmer and R. H. Hill, "Solid State Photochemistry of fac–$Co(NH_3)_3(NO_2)_3$ and mer–$Co(NH_3)_3(N_3)_3$ as Thin Films on Si(111) Surfaces," *J. Photochem. Photobiol. A: Chem.*, 72:243–249 (1993), no month.

*Metallomesogens: Synthesis, Properties and Applications*, Ed., J. L. Serrano, John Wiley & Sons, 1–21, 80–83, 108–111, 123–129, 144–153, and 188–192 (1996), no month.

Blair et al., "Photochemistry of thin amorphous films of $Fe(CO)_4PPh_3$ Si(111) surfaces," Journal of Organometallic Chemistry, 1998, vol. 554, pp. 63–73, no month.

Chu et al., "Solid state photochemistry of thin films of Cr, Mo and W organometallic compounds on silicon substrates," Materials Chemistry And Physics, 1996, vol. 43, pp. 135–139, no month.

Gao et al., "High efficiency photoresist–free lithography of $UO_3$ patterns from amorphous films of uranyl complexes," Journal of Materials Research, May 1998, vol. 13 No. 5, pp. 1379–89.

Gao et al., "The mechanism of the photoreaction of Uranyl 1,3–diketonate complexes as thin films on silicon surfaces," Journal of Photochemistry and Photobiology A: Chemistry, no month 1996, vol. 97, pp. 73–79.

Law et al., "Synthesis And Characterization Of Photochemically Produced Thin Films Of $CeO_2$ Films By Photoresist–Free Lithography," Materials Research Bulletin, no month 1998, vol. 33 No. 1, pp. 69–80.

Yonezawa, Y., et al., "Formation of Silver Metal Films by Photolysis of Silver Salts of High Molecular Weight Carboxylic Acids," Thin Solid Films, 218 (1992) 109–121, no month.

M. Zumer, Thesaurus for Liquid Crystal Research and Applications, at http://www.pesonal kent.edu/~slis/zeng/majas2.html.

* cited by examiner

METHOD FOR THE DEPOSITION OF MATERIALS FROM MESOMORPHOUS FILMS

This application is a continuation-in-part of U.S. application Ser. No. 09/875,957 filed Jun. 6, 2001, now abandoned.

FIELD OF THE INVENTION

The present invention relates to depositing patterned films of metals or metal oxides for use in a variety of applications such as the fabrication of microelectronic devices. The invention particularly relates to the photochemical deposition of metals or metal oxides from mesomorphous films containing precursor metal complexes.

BACKGROUND OF THE INVENTION

Patterned films of metal oxides, metals or other metal containing compounds are vital to the microelectronics industry but also find applications as diverse as electrodes for capacitors, conductors, resistors or as diffusion barriers for minimizing the diffusion of a metal contact into a silicon substrate. There are a number of methods of making such films. Normally films of inorganic materials are deposited by chemical vapor deposition or physical vapor deposition although in some cases sol gel or metal organic deposition methods have been used. Since none of these methods is able to pattern films, additional technologies such as photoresists must be used to form the patterned structures employed in the construction of microelectronic devices or circuits.

Methods of patterning found in the prior art have a number of disadvantages. Generally, manufacturing techniques for such devices begin with a suitable substrate, often a semiconductor such as a wafer of crystalline silicon, upon which materials having the requisite electrical characteristics are deposited. Techniques that directly apply a metal film to a semiconductor by evaporation suffer from the drawback that the evaporation heats the substrate. The high temperature produced at the interface between the evaporated metal and the substrate causes metal atoms to diffuse into the substrate and vice-versa, resulting in a layer of mixed metal and semiconductor at the metal-semiconductor interface which can interfere with the performance of the device.

Other techniques are expensive because they generally include many steps. For example, when depositing material directly on a substrate, each patterning step typically involves: applying a photoresist to the surface of the substrate; changing the properties of selected areas of the photoresist by exposing those areas to light, X-rays or an electron or ion beam; removing either the exposed or unexposed portions of the photoresist to expose portions of the underlying substrate; chemically treating or depositing a material on the exposed portions of the substrate; and removing the photoresist. A further disadvantage of many such prior art techniques is that resolution can be lost in what is essentially a two-stage masking process.

An alternative photoresist technique involves depositing a layer of material on a substrate, applying a photoresist to areas where it is desirable to retain the material, then etching the material away in places where it is not required. However, this method has the disadvantages set out above and the further disadvantage that the edges of the retained material can be rough or undercut, a defect that can ultimately lead to cracks which can cause the entire device to fail.

Another disadvantage of prior art processes is that they tend to produce a non-planar surface because the materials are often not uniformly deposited over the surface of the substrate. If a generally planar surface is required then a separate planarization step such as with chemical mechanical polishing using an abrasive slurry is necessary.

As described in U.S. Pat. No. 4,952,556 to Mantese et al., patterns of superconducting material can be made by applying films of metallo-organic material on a substrate and patterning by irradiating with a beam of particles or electromagnetic radiation. When using light from a laser, an electron beam or an ion beam, patterning can be accomplished by local heating in the film and does not require a photochemical reaction. Local heating is disadvantageous because of local degradation of the substrate and because it is hard to control with precision.

Muller, U.S. Pat. No. 5,176,744, describes a method of depositing Copper from solutions of Copper formate, by irradiating with a laser beam. Although local heating is employed to decompose the copper compound, the judicious use of crystallization inhibiting agents ensures that the film of copper-containing solution has the consistency of a highly-viscous liquid and a more uniform deposition results.

Tutt & Duraiswamy, International Publication No., WO90/02827, disclose a method of photochemical deposition of high purity gold films in which a vapor of a gold containing complex photochemically decomposed while it is passed over a substrate. Although this technique avoids the disadvantages of thermal decomposition methods, it does not permit formation of patterned layers without the use of some other technology such as a photoresist or a mask.

In the photochemical deposition method (U.S. Pat. No. , 5,534,312 to Hill et al., incorporated herein by reference) certain precursor metal complexes deposited on a silicon substrate can be caused to undergo photochemical reactions which result in the loss of the ligands associated with the metal complex. An amorphous film containing the precursor material is first applied to the substrate and is then subjected to a photochemical decomposition by irradiation with a beam of electromagnetic radiation, preferably visible or U/V light. The identity of the layer that results from the photochemical reaction can be controlled by the choice of precursor and atmosphere. For example, carrying out the photochemical reaction in air can lead to deposition of a metal oxide layer. Additionally, carrying out a first photochemical reaction in one atmosphere and a second photochemical reaction in a second atmosphere can permit patterns of two different types of material to be deposited on the substrate. The method differs from the above methods in that the reaction that creates the layer of metal, metal oxide or other metal compound is photochemically activated and in that the reaction takes place in a film on the surface of the substrate. In other prior art methods that use light as the energy source, the light initiates a thermal rather than a photochemical reaction. However, light-induced thermal reactions suffer from the drawbacks associated with local heating, as discussed above. The method also differs from previous methods in the art in that the film containing the metal complex is amorphous.

The success of the photochemical deposition method has spawned a desire to understand the properties of the precursor materials that led to the highest quality films and to a quest for additional classes of materials that are suitable, see for example, Hill, et al., *Materials Chemistry and Physics*, (1996), 43:233–237.

Consequently in one respect, it would be desirable to carry out photochemical deposition with a number of complexes that preferentially form films which are not amorphous but which have sufficient optical homogeneity for high quality lithographic applications.

SUMMARY OF THE INVENTION

The current invention describes the use of precursor metal complexes in mesomorphous, or generally liquid crystal, films, which can be converted to films of non-molecular metal containing materials by a variety of methods. Important is the utility of these films in the preparation of patterned films of metal containing materials on substrates by photolithographic methods. Previously it was thought that films of precursor materials were required to be amorphous to provide the optical properties necessary for high resolution optical lithography. It is now shown that partially ordered films may also provide the necessary optical conditions for lithography by photochemical metal organic deposition. The method can be used to make self-planar structures.

The present invention includes a method for making a pattern of a metal containing material on a substrate, the method comprising: (a) applying a mesomorphous film containing a metal complex on a surface of the substrate; (b) exposing, in a first atmosphere, a first area, having a first shape, of the film to electromagnetic radiation from a first source to cause the metal complex in the first area to undergo a photochemical reaction, the reaction transforming the metal complex in the first area into a first metal containing material adherent to the substrate and one or more ligand byproducts of a first kind at least some proportion of which are driven off during the course of the photochemical reaction, wherein the pattern comprises the first shape; (c) optionally driving off a remainder of the one or more ligand byproducts of a first kind that are not driven off during the course of said photochemical reaction. The method optionally also comprises, after the applying, (d) exposing, in a second atmosphere a second area, having a second shape, of the film to electromagnetic radiation from a second source to cause the metal complex in the second area to undergo a photo-chemical reaction, the reaction transforming the metal complex in the second area into a second metal containing material adherent to the substrate and one or more ligand byproducts of a second kind at least some proportion of which are driven off during the course of the photochemical reaction, wherein the pattern additionally comprises the second shape; and optionally (e) driving off a remainder of the one or more ligand byproducts of the second kind that are not driven off during the course of said photochemical reaction.

In one embodiment of the invention the selected atmosphere comprises oxygen and the metal containing material is a metal oxide. In another embodiment of the invention, a metal oxide produced according to the invention is reacted with a suitable chemical in a suitable atmosphere to reduce the metal oxide to a metal adherent to the substrate. Another aspect of the invention provides for the deposition of two different materials in a pattern. This aspect of the invention involves the steps of applying a mesomorphous film containing a metal complex on a surface of a substrate; placing the film in a first selected atmosphere; and exposing first selected areas of the film to electromagnetic radiation, which is preferably ultraviolet light, to cause the metal complex in the first selected areas to undergo a photo-chemical reaction. The reaction transforms the metal complex in the first selected areas into a first metal containing material adherent to the substrate. Subsequently, the film is placed in a second selected atmosphere; and second selected areas of the film are exposed to electromagnetic radiation to cause the metal complex in the second selected areas to undergo a photochemical reaction. The reaction transforms the metal complex in the second selected areas into volatile components and a second metal containing material adherent to the substrate.

The metal complex is preferably selected from the class of compounds known as metallomesogens. The metal complex comprises one or more metal atoms bonded to one or more ligands. In one aspect of the invention at least one ligand comprises an alkyl group. Preferably the ligands are selected from the group consisting of: carboxylates; pyridines; amines; diamines; arenes; alkoxy ligands; alkyl ligands; and aryl ligands. For applying metals, metal oxides and metal sulfides, the ligands are preferably small and do not comprise any organic groups containing more than 26 carbon atoms when one or more aryl groups is present. Most preferably, if the ligands do not include phenyl groups then the ligands do not comprise any organic groups containing more than 12 carbon atoms. In a preferred embodiment, the metal complex is a homonuclear dimetal complex. In another preferred embodiment, the ligand is a carboxylate, $O_2CR$, wherein R is selected from $C_{1-20}$ alkyl or $C_{1-20}$ alkenyl or $C_{1-20}$ alkynyl.

The invention has particular application in forming patterned films comprising metal oxides and/or metals. Other applications include the interconnection of components on semi-custom chips and the patterning of integrated circuits, either instead of or in conjunction with photoresist based patterning. The methods of the invention may be used in the manufacture of VLSI devices.

BRIEF DESCRIPTION OF THE DRAWINGS

Additional objects and features of the invention will be more readily apparent from the following detailed description and appended claims when taken in conjunction with the drawings, in which:

The drawings are necessarily of a schematic nature since the thickness of the individual layers are too thin and the thickness differences of the various device elements too great to permit depiction to scale or to permit proportionate scaling. Like numerals in the drawings refer to like portions.

DESCRIPTION OF PREFERRED EMBODIMENT

This invention provides a process for making a structure comprising a film on a substrate. The film is patterned and has areas comprising one or more different materials. Unlike most prior art processes, the process does not require the steps of applying and removing a photo-resist or similar material to the structure being fabricated.

Figure 1:
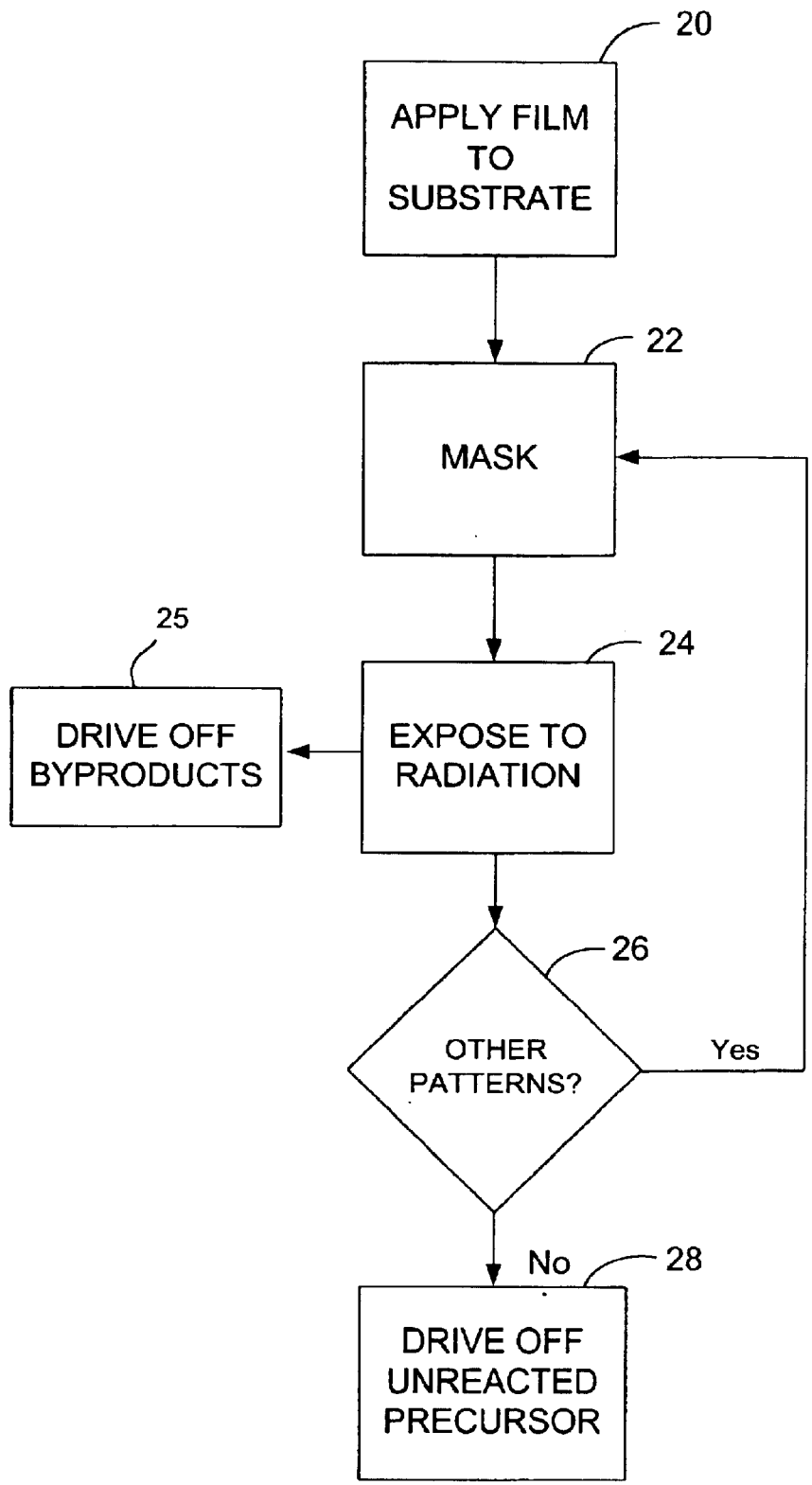
FIG. 1 is a block diagram outlining the steps in practicing an exemplary method according to the invention.

FIGS. 1, 3, 4 and 5, illustrate the use of the process of the invention to create a patterned film. In outline, the method of the present invention is shown in FIG. 1. At step 20, a mesomorphous film 40 containing a precursor metal complex 41 is applied to a substrate 44. At step 22, a mask is placed over the film to expose an area of the film. At step 24, an area of film 40 is selectively converted to a metal containing material by photo-chemically reacting the area of film 40 in a chosen atmosphere. At step 25, while the photochemical reaction is occurring, byproducts are driven off from the film. At step 26, the foregoing masking and exposing steps can be repeated for additional areas of the film. Finally, any trace quantities of reaction byproducts and any unreacted precursor metal complex can be driven off, step 28. In an alternate method of the present invention, the differential solubility of the reaction byproducts and the unreacted precursor is exploited. Owing to the expense of using the optics associated with carrying out the photochemical reaction, it can be advantageous to run the photochemical reaction partially to completion. In this way, exploiting the difference in the solubilities of the byproducts and the unreacted precursor, the byproducts can be driven off, for example by using some suitable solvent, and then the reaction can be completed later using a cheaper light source.

It is also envisaged that the foregoing steps can be practiced more than once consecutively, for example with different precursor complexes for the purpose of creating patterns of materials containing different metals. In such a scheme, a second layer of metal containing material could be created on top of an existing layer, or alongside an existing layer, in areas of the substrate not covered by the existing material. Such an application of the present invention could permit, for example, the creation of an aluminum oxide ($Al_2O_3$) layer on top of a rhenium layer. The metal complexes which may be used to practice the invention are discussed herein.

Materials

Figure 2:
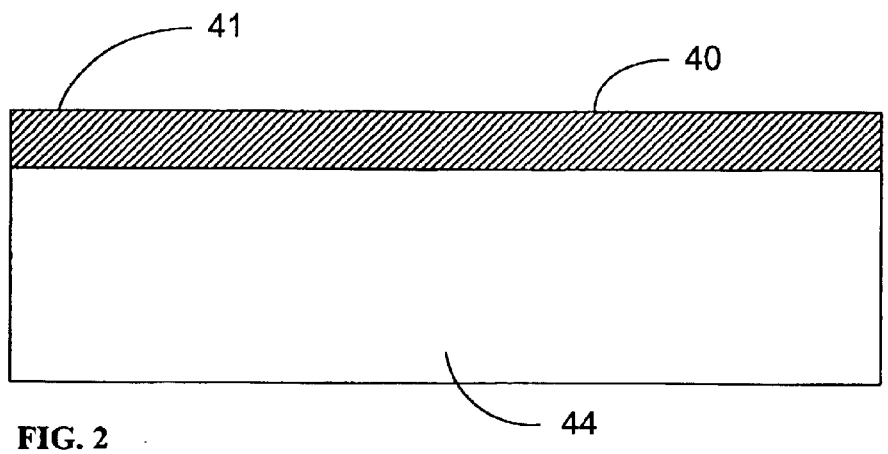
FIG. 2 is a schematic diagram of a mesomorphous film on a substrate.

The method of the present invention provides for application of a mesomorphous film 40, containing a precursor metal complex 41, to a substrate 44. As shown in FIG. 2, the mesomorphous film 40 preferably is in direct contact with substrate 44. In alternate embodiments, a layer of another material such as a contact, insulator or other film may be interposed between the mesomorphous film and the substrate, either over the entirety of the substrate or over only one or more parts of it. The mesomorphous film 40 may be described as liquid crystalline, a one-dimensional crystal, or as 'partially ordered' in nature. The mesomorphous materials used herein will also be referred to as liquid crystals. In general, mesomorphous film 40 comprises one or more phases and is intermediate between a crystalline solid and a normal isotropic liquid. Such phases are often referred to as mesophases. The mesomorphous film preferably exhibits some crystalline properties such as long-range order in at least one dimension, but does not comprise simple crystals. In particular, the molecules in the mesomorphous film retain some orientational order with respect to one another but little or no positional order. Preferred materials that give rise to the mesomorphous layer are liquid crystals. Alternative materials are those that give rise to lamellar phases such as are provided by surfactants. Less preferable materials include those described as semi-crystalline, micro-crystalline, and those with plastic phase structures. Preferably the mesomorphous film comprises one or more metal complexes that in themselves exhibit liquid crystal properties. Such complexes have been referred to as metallomesogens though the scope of the present invention is not to be limited by that term of art. In a preferred embodiment the film comprises a precursor metal complex in high purity, preferably >90% by mass, more preferably >95% by mass and most preferably >99% by mass per unit area of the film. In another embodiment, the film comprises a mixture of metal complexes whose combined fraction by mass preferably exceeds 90% per unit area of film. In still another embodiment, the film comprises a metal complex mixed with one or more other materials that impart a liquid crystal structure on the film. However the material employed is described, it must provide apparent macroscopic optical homogeneity during the lithographic process, i.e., inhomogeneity must be insignificant during the experiment.

Whether a film is mesomorphous, amorphous or crystalline depends primarily upon the identity of its constituent molecules, i.e., preferably the precursor metal complex 41. In general, any of the methods of deposition described hereinbelow may be used to apply a mesomorphous film to a substrate, though the conditions of deposition may be adjusted to modify the structural character of the film. Preferably the mesomorphous nature of the film arises from its method of assembly, i.e., the method of deposition can impose an ordered structure on the film, regardless of whether the film itself tends naturally to adopt its mesomorphous structure. In one embodiment of the present invention, the film may be formed by the methods used to create Langmuir-Blodgett films, i.e., is assembled.

Preferably the mesomorphous film comprises layers of molecules of the precursor metal complex 41. The planes of the layers of molecules are preferably approximately parallel to the surface of the substrate. The molecules in each layer may be oriented so that their axes of inclination are other than parallel to the planes of the layers. In a preferred embodiment, there are about 100 layers of precursor molecules in the film. In another embodiment there are approximately 50–100 layers and in another embodiment there are 100–1000 layers. Typically the thickness of the film is about 100 nm, though choice of solvent, coating method and choice of ligands on the metal complex can permit a range of film thicknesses to be formed. In general, it is preferred that the thickness of the film is smaller than the wavelength of the light used in the photolithographic process. If this is true, optical effects that arise are dominated by reflections between the front and rear of the film. Preferably there is ordering within each of the layers of molecules but molecules of adjacent layers are not aligned with respect to one another. Also preferably, the layers have an approximately regular spacing with respect to one another. Consequently, the mesomorphous material preferably does not have a domain structure and preferably does not exhibit turbostratic ordering in which parallel layers are aligned with respect to one another in domains. Where there is large scale alignment in small regions it is preferably for areas no greater than 1 $\mu$m by 1 $\mu$m and even more preferably for areas no greater than about 0.1 $\mu$m by about 0.1 $\mu$m.

Different categories of liquid crystals, according to structure and properties are described in *Liquid Crystal Devices: Physics and Applications*, V. G. Chigrinow, (1999), Artech House, incorporated herein by reference. A listing of liquid crystal categories can also be found on the web-site of the library of Kent State University in a listing entitled "Thesaurus for Liquid Crystals Research and Applications" compiled by Marcia Lei Zeng. Any of the categories of liquid crystals described hereinbelow are suitable for practicing the present invention. Liquid crystals may be thermotropic, whose structure can undergo a temperature-induced phase transition to either solid or liquid phase, or lyotropic, whose liquid crystalline structure is induced by the admixture of two components. Additionally, certain liquid crystals that exhibit both thermotropic and lyotropic properties have been referred to as amphotropic. In a preferred embodiment, the mesomorphous film comprises a thermotropic liquid crystal and may be either enantiotropic, i.e., is thermodynamically stable, or monotropic, i.e., is metastable. According to the method of the present invention, the mesomorphous film comprises a thermotropic liquid crystal whose structure can be further described as any one of: nematic, homogeneous nematic, homeotropic nematic, tilted nematic, hybrid nematic, super-twisted nematic, cholesteric-nematic, discotic, columnar, discotic cholesteric, discotic isotropic phases, discotic nematic, thermotropic rodlike ('calamitic'), rodlike cholesteric, rodlike isotropic, rodlike nematic, phasmidic, sanidic, smectic, smectic A, smectic A1, smectic A2, smectic Ad, smectic TGB, smectic B, crystal B, hexatic B, smectic C, smectic C*, ferroelectric, ferrielectric, antiferroelectric, smectic E, smectic F, smectic G, smectic H, smectic I, or any of the other forms of smectic liquid crystal. Smectic A and C are often called 'fluid mesophases'. In a preferred embodiment, the mesomorphous film comprises a liquid crystal whose structure is nematic. In another preferred embodiment, the mesomorphous film comprises a liquid crystal whose structure is smectic. Terms used to describe thermotropic liquid crystals can refer to the arrangement of the molecules within the liquid crystal, e.g., smectic, or the shapes of the molecules themselves, e.g., calamitic and discotic. Some thermotropic liquid crystals defy the classifications discotic and calamitic and have been called phasmidic or sanidic. Any of the foregoing thermotropic liquid crystals is compatible with the methods of the present invention. The mesomorphous film can alternatively comprise a lyotropic liquid crystal whose structure can be further described as any one of: Lyotropic, Cubic, Hexagonal, Lamellar, Micellar, Micellar isotropic, Micellar nematic, Micellar biaxial, Micellar disclike, Micellar rodlike, or columnar. Lyotropic liquid crystals have also been categorized as chromonic and amphiphilic. The term chromonic has been applied to lyotropic phases comprising disc-like molecules, self-organized into columnar mesophases. It is also consistent with the present invention that the mesomorphous film is amphotropic. Other classifications of liquid crystals and mesophases are possible, as are categories which lie outside those described hereinabove. Molecules which are so classified or lie in such categories are also suitable for the practice of the present invention.

The extent of crystalline order in the mesomorphous film 40, which consists of a partially ordered material, can be ascertained from an X-ray diffraction pattern of the film. Typically, such a pattern consists of a distinctive pattern expected from diffraction associated with planes separated by molecular dimensions. Such a pattern is often associated with a smectic phase. Often a broad reflection of X-rays consistent with non-crystalline hydrocarbon chains similar to that observed in paraffin is also present in these spectra.

Within the mesophase, the molecules of the liquid crystal may align within layers according to a number of possible arrangements. In calamitic mesophases, the idea of a 'director' is useful. A director is a vector that is parallel to the longitudinal axis of a molecule of the liquid crystal. Typically, molecular directors align parallel with one another in a liquid crystal but the relationship between directors in different layers and the orientation of the directors with respect to an external reference direction may determine a number of differences in properties between different mesophase materials.

In a preferred embodiment, the molecules in a calamitic phase align with their directors parallel to the normal to the mesomorphous film but without positional order within the layers, as in smectic A. The molecules may also be tilted with respect to the layer normal, as in smectic C phase. In another embodiment, the liquid crystal molecules may exhibit intra-layer positional order such as in the smectic B, F and I hexatic phases. Less preferred embodiments are the so-called crystal smectic phases in which molecules show intra-layer as well as inter-layer positional order, for example, smectic B, E, G, H, J and K. Additionally, if the liquid crystal molecules are chiral, or if some component of the mesophase consists of chiral molecules, for example if precursor metal complex 41 is chiral, the liquid crystal may adopt a chiral-nematic or cholesteric phase.

In one embodiment, the molecules form a discotic mesophase. In a discotic phase molecules are usually disc-like but they may have other shapes. It is normally convenient to refer to a principal molecular plane containing the two axes corresponding to the two smaller moments of inertia of the molecule. The principal molecular planes are typically parallel to one another in the discotic phase. The molecules may be heaped randomly like a pile of coins, in which case the phase is nematic. Alternatively, the molecules may be stacked in columns, like gambling chips at a roulette table, in which case a nematic columnar phase results. Stacked columns of molecules may additionally have positional order to form a periodic two-dimensional array such as in discotic rectangular, discotic tetragonal or discotic hexagonal. The principal molecular planes may also be tilted with respect to the plane of the liquid crystal in any of the foregoing examples as well as in a discotic lamellar phase.

In another embodiment, the liquid crystal molecules form a lyotropic mesophase. When the lyotropic phase is chromonic, i.e., is formed from discotic molecules, the structural possibilities parallel those found in the discotic mesophase described hereinabove. Amphiphilic molecules, usually mixed with at least one other component such as a solvent, also give rise to lyotropic mesophases. Amphiphilic molecules have a tendency to aggregate into micelles, so the lyotropic phase usually comprises one of a number of categories of micelle, for example, plate-shaped, columnar and spherical. The way in which the micelles arrange themselves gives rise to a number of different structural forms. For example, discotic micelles lead to nematic discotic or lamellar phases. Rod-like micelles can give rise to hexagonal columnar phases, whereas spherical micelles lead to a cubic micellar phase.

Important characteristics of the mesomorphous films of the present invention are that they have sufficient disorder and have the capacity for sufficient molecular motion that photo-decomposition is efficient and that high definition optical lithography is practical. The extent of molecular disorder need not be complete. It was previously thought that the presence of any crystalline regions within the film would result in optical effects associated with the crystallinity that would be detrimental to the lithographic process. For example, it was found that micro-crystalline powders exhibited poor characteristics for high quality non-thermal lithography. It was understood that a crystalline film loses its crystalline structure during the course of the photochemical reaction, thereby causing its optical properties to change while the reaction proceeds. Surprisingly, however, it has been found that a mesomorphous film does not appear to provide effects substantially detrimental to the lithographic process, even though some of its orientational molecular order is lost during the course of the photochemical reaction. Without wishing to be bound by a particular theory of operation, this is possibly, in part, because the main order in the liquid crystal is orthogonal to the direction of propagation of the light. Light passes perpendicular to the plane of the film, i.e., along the c-axis of the liquid crystal or mesomorphous film. When there is little or no inter-layer ordering, the liquid crystal appears to be amorphous to the propagated light and the light does not change direction appreciably on its passage through the layer. In contrast, in a crystalline film, or one whose molecular layers are ordered with respect to one another, the path of the light can be caused to change direction through refraction and the efficiency of the photochemistry is decreased. Furthermore, when there is ordering in more than one dimension optical birefringence effects can be detrimental to the lithographic process.

A second factor which makes the liquid crystal film a potential reaction medium for photolithography is that the intermolecular forces per unit surface area of each molecule are weaker than those found in three dimensional crystals. Thus, even for a material composed of large molecules, the intermolecular forces between a portion of one molecule and a portion of another molecule are relatively weak. The ease with which the liquid crystal molecules can then reorient with respect to one another allows for the self healing of any defects formed in the liquid crystal during the lithographic process. To this extent the film accommodates sufficient molecular diffusion that it should heal during the course of the photochemical reaction. Such a property can be referred to as 'self-healing'. This property also assists in the driving off of unwanted byproducts of the photochemical reaction. In this regard, lyotropic liquid crystals are particular suitable to the methods of the present invention.

A further advantage of a mesomorphous material to construct the thin film is that it can readily form self-planar structures, i.e., it can form a uniformly planar film without the need for a planarization step. In one respect, if the film is formed on a rough surface, but the film is thick enough to totally cover the bumps and notches in the surface, the layer-like nature of the liquid crystal material ensures that the layers stack up and that the uppermost layer is almost perfectly flat. Alternatively, for very thin films of mesophase material, the surface tension of the liquid crystal can lead to a conformal coating.

The material of substrate 44 may be any one of a wide variety of materials which, for the purposes of the invention, are compatible with mesomorphous film 40 and the metal complex 41. Substrate 44 should be a material which does not impair the photochemical reactions described hereinbelow and to which film 40 is capable of adhering and also to which the metal containing material to be deposited will adhere. If the device being manufactured will be exposed to large thermal variations then substrate 44 should have a coefficient of expansion reasonably well matched to that of the metal-containing material to be deposited. However, because this invention does not require high temperature process steps, it is not as important for the coefficient of expansion of the substrate to be matched to that of the material being deposited as it is in prior art methods. Substrate 44 may be, for example, a clean silicon wafer or chip which may be etched or may have an oxide or polyimide coating, or a quartz slide. Substrate 44 may also be an aluminum-based material such as aluminum oxide, ($Al_2O_3$) or aluminum nitride (AlN), or aluminum metal itself.

Application of a Film of Precursor

The order of the steps of the method of the present invention is not intended to be limited to that shown in FIG. 1.

At step 20 of the method of the present invention, a mesomorphous film 40 of a precursor metal complex 41 is applied to a substrate 44. Film 40 may generally be conveniently applied to substrate 44 by spin-coating and typically has a thickness of between about 20 nm and several $\mu$m.

Films may be applied by spin coating onto a surface of substrate 44. Spin coating has the advantage that it is a low cost method to apply films. An even film containing the precursor is formed by this process. The spin coating can be carried out by placing a volume of a solution of metal complex 41 in a chemically compatible solvent onto substrate 44, mounted onto a spinning chuck, and then rotating substrate 44. The speed of rotation and the concentration of the solution can be changed to control the thickness of the film. The parameters depend upon the spin-coater used: for example, the speed of rotation can be 100's of R.P.M. or 1,000's of R.P.M. In the alternative, a volume of metal complex 41 in solution may be dispensed on a spinning substrate. A chemically compatible solvent is one that does not react appreciably with the metal complex 41 and is one that can be driven off easily while spinning as well as after the film is applied to the substrate. An example of a solvent is methylene chloride though others known to one of skill in the art are acceptable. With a solution having a metal complex concentration of about $1.6 \times 10^{-2}$ M and a spin speed of 725 R.P.M., a film having a thickness of approximately 90 nm (roughly 90 monolayers) is formed. The spin coating may be carried out at room temperature. After the spin coating is complete, the resulting film is allowed to dry. In the spin coating process it may be advantageous to chemically modify the substrate surface prior to coating in such a way as to optimize the spin coating process. The spin coating of metal complex 41 on a substrate 44 may generally be accomplished with the same equipment used to apply films of photoresist in prior art processes. For example, a commercial spin coating machine, of a type available from Headway Research Inc., of 3713 Forest Lane, Garland, Tex., may be used.

The thickness of film 40 may be tailored, as is known in the spin coating art, by adjusting the rate of spin of the substrate, the viscosity of the solution, and the concentration of the solution. In some cases, the rate of feed of the solution is also a factor. The thickness of film 40 depends upon the desired end product. Where the goal is to deposit a very thin layer of metal containing material, for example titanium, for use as a binding agent then mesomorphous film 40 should be in the range of 20–50 nm. Where the goal is to deposit a conductor approximately 0.5 $\mu$m thick then film 40 is most preferably in the range of approximately 2–5 $\mu$m thick. Where the goal is to produce a layer of a dielectric material then film 40 preferably has a thickness between 20 nm and about 5 $\mu$m. In any case, it is preferred that film 40 be as thin as possible to achieve its desired goal. The thinner the film, the easier it is for reaction by-products to diffuse out of the film and the easier it is to completely expose the films to light.

Other methods of deposition, such as dip coating, spray coating, or evaporation methods may also be used, provided that the mesomorphous structure of the film is not disrupted during or by the deposition process. Whether or not a mesomorphous film is formed is not normally dependent upon a particular method of deposition, though the method of deposition may determine properties of the film such as the orientation of its layers with respect to the substrate.

Prior to applying mesomorphous film 40, the substrate may optionally be pretreated to create a preferential alignment direction for the molecules of the mesomorphous film.

Techniques of pretreatment are known to one of skill in the art but may include chemical etching, vapor bombardment, or rubbing. Preferably the substrate surface is not chemically altered by this process. In an alternative embodiment, different areas of the substrate surface can be pretreated in different ways so that different alignment directions are produced.

Reaction of Film of Precursor

In overview, metal complex 41 in illuminated areas 60 of mesomorphous film 40 reacts under the action of the light in first atmosphere 50 in a low temperature photochemical reaction to form a metal-containing material 70 which is adherent to substrate 44. For example, the first atmosphere may be air and metal-containing material 70 may be a metal oxide. In non-illuminated areas 61, metal complex 41 does not react with first atmosphere 50 because the light necessary for the chemical reaction is not present.

Figure 3:
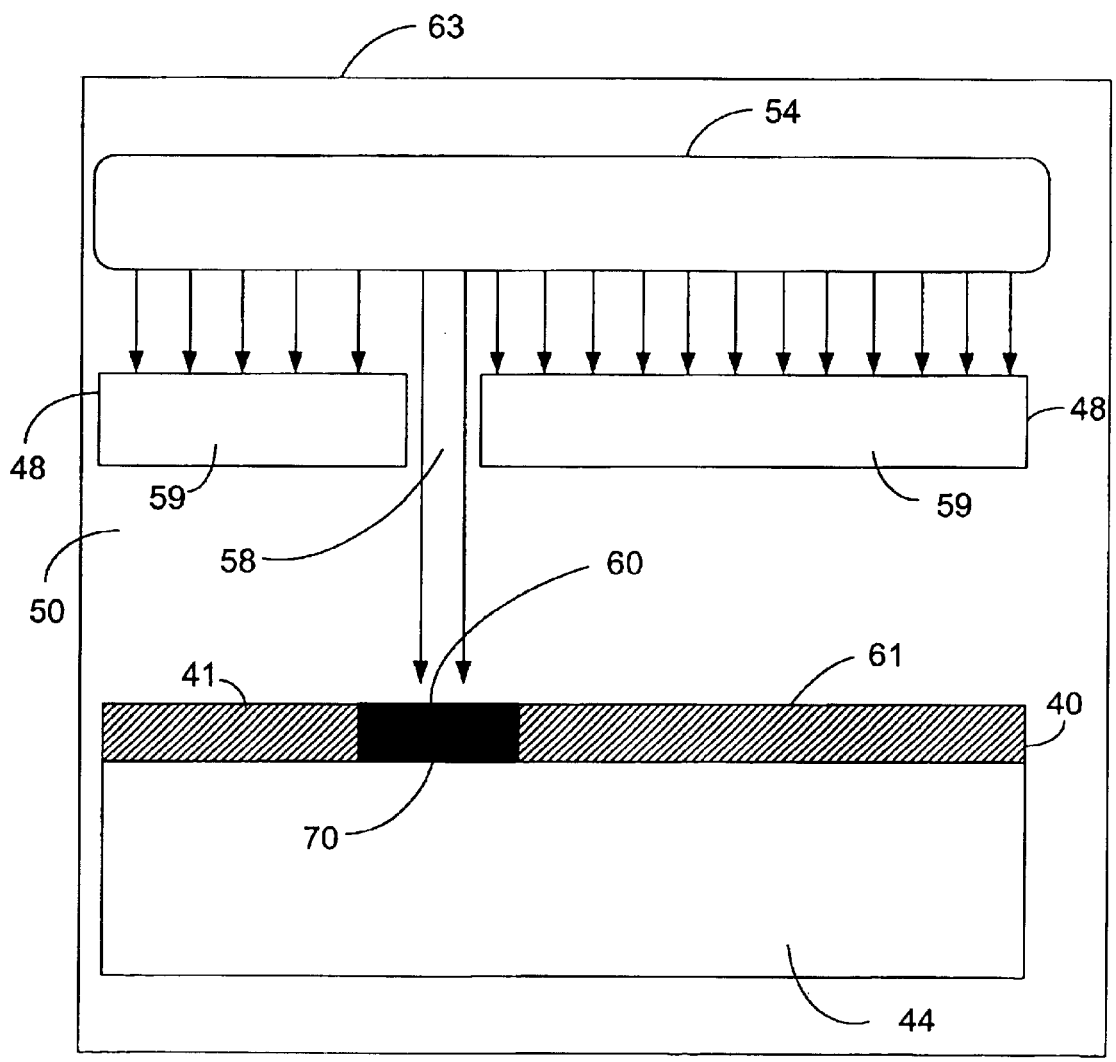
FIG. 3 illustrates the creation of a first patterned film on a substrate according to the method of FIG. 1.

In step 22, a first optical mask 48, used to define an image on the surface, is aligned over film 40 placed in a first atmosphere 50, as shown in FIG. 3. First mask 48 is shown in cross-section in FIG. 3 and may or may not comprise contiguous pieces of material. Typically, first optical mask 48 has at least one opaque area such as 59 and at least one transparent area such as 58. Transparent areas such as 58 correspond to first area 60 in which it is desired to convert mesomorphous film 40 into a different material. First area 60 has a first shape that defines at least a portion of the pattern that is desired to deposit on substrate 44. The mask 48 may also include optical enhancing features such as a phase shift technology, to enable patterns with fine details to be constructed.

In step 24, mesomorphous film 40 is exposed to electromagnetic radiation directed through first optical mask 48. Exposure of the film 40 with electromagnetic radiation results in a chemical reaction within the film which changes the precursor metal complex in the first area to a first metal-containing material adherent on the substrate 44. The side of mask 48 away from film 40 is exposed to electromagnetic radiation from a light source 54. The resolution of the process of deposition is generally limited by diffraction of the light from light source 54 around first optical mask 48. Light from light source 54 passes through one or more transparent areas 58 in mask 48 and illuminates one or more corresponding areas 60 of film 40. Other areas 61 of film 40 are in the shadow of first mask 48 and are not illuminated.

The light source 54 may produce light of a specific wavelength, or may be a coherent light source of a specific wavelength; or may be a broadband light source. Light source 54 emits electromagnetic radiation of a wavelength, typically in the blue or ultraviolet region of the spectrum, which is absorbed by metal complex 41 in first area 60. In general, shorter wavelengths of electromagnetic radiation are preferred because short wavelengths offer higher pattern resolution. In one embodiment, the electromagnetic radiation is in the X-ray region of the electromagnetic spectrum. For the examples discussed herein, light source 54 may be a Xe lamp or a Hg vapor lamp, such as a 100 W high pressure Hg vapor lamp in an Oriel™ housing, equipped with condenser lenses and a 10 cm water filter with quartz optics. Additionally, a HeCd laser emitting light at 325 nm and/or 416 nm has useful properties for use as a light source in association with many metal complexes 41.

Figure 4:
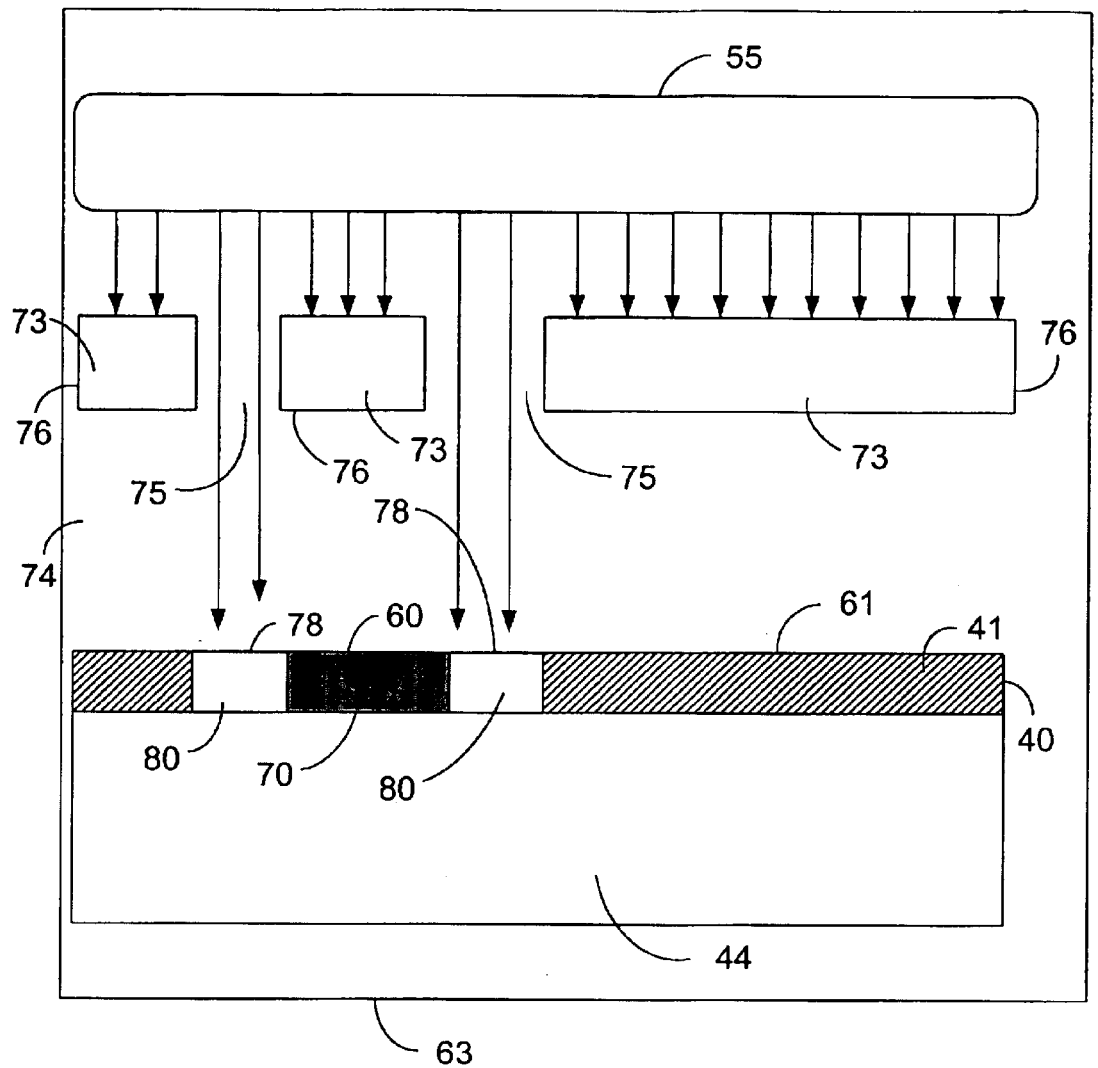
FIG. 4 illustrates the creation of a second patterned film on a substrate according to the method of FIG. 1.

As shown at Step 26, if other patterns of different materials are desired, steps 22 and 24 may be repeated, with different masks in different atmospheres, to form areas of other metal-containing materials on substrate 44. For example, as shown in FIG. 4, film 40 is placed in a second atmosphere 74 which may be the same as or different to first atmosphere 50. A second mask 76 is aligned over film 40. Second mask 76 comprises one or more opaque areas 73 and one or more transparent areas such as 75. Second mask 76 is then exposed to light from a second light source 55 which may or may not be the same as first light source 54. The wavelength of the electromagnetic radiation may be different from that used in depositing the first metal-containing material. The light from second light source 55 passes through transparent areas 75 in second mask 76 and illuminates at least one second area 78 of film 40. Second area 78 has a second shape that defines at least a portion of the pattern that is desired to deposit on substrate 44. In illuminated areas 78 of film 40 metal complex 41 reacts under the action of the light, in the second atmosphere 74 to form a second metal-containing material 80. Portions of film 40 in non-illuminated areas such as 79 and 61 of film 40 are unaffected. The result, as shown in FIG. 4 is a deposited film comprising regions of first metal containing material 70 and second metal containing material 80.

The light does not necessarily have to be directed through an optical mask. For example, if patterning is desired, a direct writing approach may be used. In a common implementation of the direct writing process a laser beam is directed in a serial fashion over the surface resulting in exposure only of the areas where the beam was directed. Alternatively, near field optical systems allow selective exposure of some areas of the surface. If it is not necessary to pattern the material, a flood exposure may be used.

The atmosphere 50 in which the photochemical reaction steps of the process of this invention take place may be an inert gas atmosphere such as helium, neon, xenon or krypton, or may be air, nitrogen gas, or a gas containing a reactive element such as hydrogen or fluorine or a reactive compound such as methane, or may be a vacuum. Normally the atmosphere above the substrate during the exposure is air. When the atmosphere is a gas other than air, in one embodiment the substrate and optionally the mask and light source can be mounted in a sealed chamber 63. In an alternative embodiment, a chamber is used but is not sealed. In another embodiment, the atmosphere can be maintained by a flow of gas over the substrate without the use of a sealed chamber. This last embodiment is particularly convenient for use with a 'stepper', wherein focused light is shone through a mask that is only as big as an individual chip. The stepper causes the position of the mask to move across the wafer thus permitting patterns on individual chips to be fabricated separately.

It may for a variety of reasons be preferable to change the composition of the atmosphere present during exposure. One reason is to increase the transmission of the exposing light when short wavelength light, which may be attenuated by air, is used. It may also be desirable to change the composition of the atmosphere to alter the composition or properties of the product film. For example in air or oxygen the exposure of a metal complex normally results in the formation of a metal oxide. By changing the humidity of the atmosphere the amount of water in the film may be changed. By eliminating oxygen entirely from the atmosphere a film consisting of primarily metal may be formed. By increasing the intensity of the light it is possible to initiate thermal reaction within the films to generate product films by a mechanism other than photochemical deposition.

In the simplest implementation of the present invention the exposure causes a chemical reaction to form a product metal-containing material such as 70 which is not soluble in the solvents that the precursor metal complex or byproducts of the reaction are soluble in. In this case exposure of the surface to suitable solvents, step 28, will dissolve away any quantities of the unreacted precursor metal complex and any remaining reaction byproducts to leave a pattern of the photochemical product of the reaction of the precursor material. It is preferred that the reaction byproducts are all driven off during the course of the photochemical reaction, step 24. It is also preferred that the precursor metal complex react substantially completely before step 28.

The time required to complete the photochemical reaction varies with the thickness of the film and the intensity of the applied light. The speed of the photochemical reaction varies from metal complex to metal complex. Typical exposure times vary according to the power of the lamp employed and the nature of the precursor metal complex in question. Exposure times can range from about 2 minutes to several hours. Examples of light sources employed include a 50 W Hg vapor lamp and a 100 W Hg vapor lamp. Light from light source 54 should be have an intensity effective enough to speed the reaction without interfering with the reaction itself. The light used should not be so intense as to unduly heat the substrate. For example, it is possible to heat the surface locally to temperatures in excess of 1000° C. with light. For the purposes of the present invention, such temperatures are undesirable. In general, the temperature of the substrate should be maintained at a temperature lower than the annealing temperature of metal containing material 70 so that diffusion of material on the boundary with the substrate is minimized. The temperature should also be maintained lower than the temperature at which metal complex 41 thermally decomposes. In most cases the temperature of the substrate should not exceed about 320° C. and preferably should be no higher than some lower temperature. It is a feature of the invention that, if necessary, many useful metal-containing materials 70 may be deposited at temperatures as low as room temperature, which is impossible with most prior art photo-thermal processes.

Figure 5:
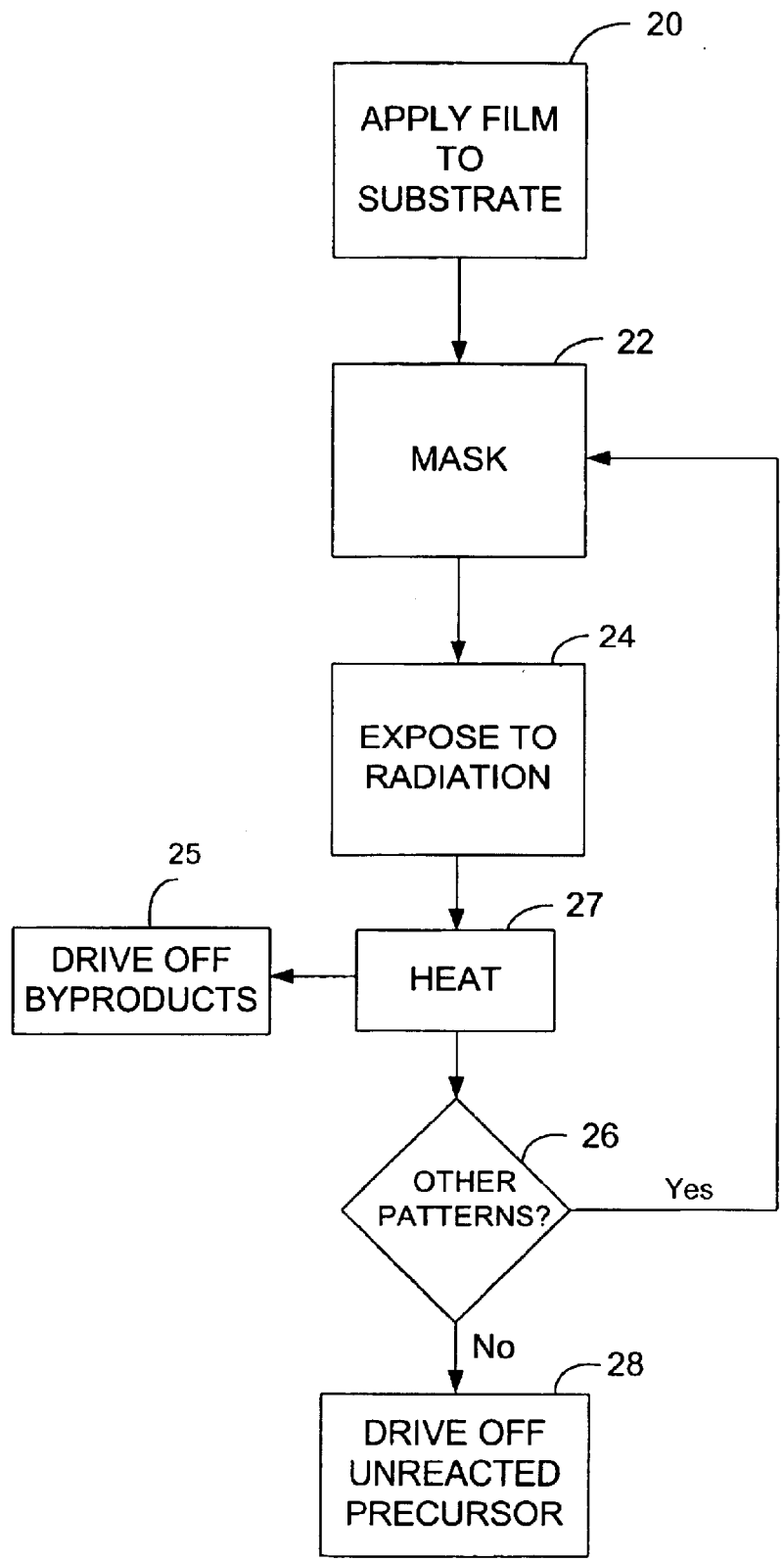
FIG. 5 is a block diagram of an alternative embodiment of the method of the present invention.

In an alternative method according to the invention, as shown in FIG. 5, film 40 is heated at step 27 in atmosphere 50 after step 24 to a temperature at which first new material 70 is stable but metal complex 41 is unstable. The heating permits reaction byproducts to be driven off. The areas of film 40 which comprise metal complex 41 react at the increased temperature to form a different material. The chemical composition of the areas of film 40 which comprise material 70 are either substantially unaffected by the heating or are affected differently by the heating. The result is a film 40 in which areas 60 and areas 61 have different properties from one another.

In another embodiment, exposure may be to ion or electron beams instead of electromagnetic radiation. These are normally directed in a serial writing process. The ion or electron beam is directed onto the film of precursor causing reaction to produce the metal containing material in the exposed areas. The nature of the exposure systems for ion and electron beams is such that these are normally carried out in a vacuum. The deposit from such a process may, depending upon the conditions, be the metal which upon exposure to air may be oxidized to form the oxide.

The process of the present invention can be used to directly deposit a metal film. To generate high quality metal films it may be preferable to create a patterned metal oxide film by the above methods and to then transform the metal oxide into a metal by reaction with a suitable reagent, such as hydrogen gas. This approach is not ideally used to deposit films of metals such as aluminum which have very stable oxides. Aluminum films may be directly deposited as described above.

Directly deposited thicker metal films tend to have relatively poor quality because metal is opaque to light. Metal formed at the surface of film 40 tends to block light from reaching deeper portions of film 40. The thickness at which opacity becomes a problem varies according to the metal. A metal film also tends to interfere with the diffusion of gaseous reaction products out of film 40. Directly deposited metal films may be useful as resistors and, where high conductivity is desired, can generally be made into better conductors by annealing. For example, where the conductor is copper, annealing of the film after deposition may be carried out at 300° C. for ½ hour. In general, where an annealed film is desired, films made according to the invention may be annealed at temperatures at the low end of the range of generally accepted annealing temperatures for a given metallic material.

Metal Complexes

Precursor metal complex 41 may be completely inorganic, organometallic or metal organic. Metal complex 41 may be selected from the class of materials known as "metallomesogens" (see, for example, *Metallomesogens: Synthesis, Properties and Applications*, Ed., J. L. Serrano, (1996), John Wiley & Sons) in that it preferentially forms a mesomorphous phase or, generally, a liquid crystalline state. Metal Complex 41 is preferably a non-ionic material such that at least one of the metal atoms is bound to one or more ligands by a covalent or coordinate bond. Examples of such a bond include those that are represented as dative covalent, σ-type, π-type, δ-type, and involve a sharing of one or more electrons at least partially between one or more ligand atoms and one or more metal atoms. Metal complex 41 may comprise a chelated metal atom, a metal atom involved in a "sandwich" type structure, as is found in ferrocene, for example, or a metal-metal bond. It is also consistent with the present invention that metal complex 41 can be ionic, such as may be preferable when forming a lyotropic liquid crystal. It is still further consistent with the method of the present invention that molecules of metal complex 41 can be cross-linked or joined together to form, respectively, macroscopic sheets and polymeric chains as may be found within liquid crystalline polymers. In general, metal complex 41 is a complex of the formula $M_n L_m$, wherein n=1, 2, . . . and m=1, 2, . . . and wherein M represents a metal atom and L represents a ligand.

In a preferred embodiment, n=1 or 2. Metal atoms M within a given molecule may all be identical or may be different from one another, i.e., metal complex 41 can have formula $M'_a M''_b L_m$ wherein metal M' is not the same as metal M" and a+b=n. For example, metal complex 41 may be a heterodinuclear metal complex. Where metal complex 41 contains more than one metal atom, a pair of metal atoms may be bonded directly to one another or there may be a ligand interposed between a pair of metal atoms. Where metal atoms are bonded directly, they may be connected by a single bond, double bond, triple bond or quadruple bond or by a bond whose order is intermediate between one of the foregoing.

Metal M may be an alkali metal (e.g., Na), an alkaline earth metal (e.g., Ba), a transition metal (e.g., Cu), a main group metal (e.g., Al), a lanthanide (e.g., Eu) or an actinide (e.g., U). M may also be selected from main group elements that are non-metallic, metalloid or semi-metallic, for example, silicon, germanium, gallium, arsenic and boron. In a preferred embodiment, the metal is selected from the group consisting of copper (Cu), nickel (Ni), platinum (Pt), palladium, (Pd), rhodium, (Rh), ruthenium, (Ru), rhenium (Re), molybdenum (Mo), chromium (Cr), tungsten (W) and iron (Fe). In another preferred embodiment, the metal atom is selected from the group consisting of lead (Pb), mercury (Mg), tin (Sn), silicon (Si) and germanium (Ge). Particularly preferred are the metals rhenium (Re) and ruthenium (Ru). Examples of complexes of ruthenium and osmium that exhibit liquid crystalline behavior are described in M. A. S. Aquino, "Diruthenium and diosmium tetracarboxylates: synthesis, physical properties and applications", *Coord. Chem. Rev.*, (1998) 170:141–202, incorporated herein by reference. In general, molecules of metal complex 41 should be as small as possible while having the mesomorphous and other properties necessary to practice the invention.

In a preferred embodiment, m=1, 2, 3, 4 or 6. Ligands L may all be identical or may be different from one another, i.e, metal complex 41 can have formula $M_nL'_pL''_q$ wherein ligand L' is not the same as ligand L" and p+q=m. It is within the scope of the present invention that 3 or more ligands are all different from one another. It is also within the scope of the present invention that, when more than one type of ligand is present, more than one type of metal is present.

Requirements of ligands L are such that metal complex 41 has the properties that: 1) it can be applied as a mesomorphous film onto a substrate; 2) the mesomorphous film is stable or, at least, metastable; 3) on absorbing light of a required wavelength in a selected atmosphere, the metal complex can be transformed into a different metal containing material through a photo-induced chemical reaction; and, 4) any byproducts of the photo-induced chemical reaction should normally be sufficiently volatile to be easily removed from the film. Ligands L preferably include at least one ligand that has an organic R-group such as an alkyl chain.

Liquid crystals are often formed from 'rod-like' molecules, as may arise from species containing long alkyl chains, but with sufficient polarity that alignment of the molecules is ordered in at least one dimension. Ability of metal complex 41 to form certain types of liquid crystal such as calamitic, is known to arise from a compromise between the length of the alkyl-chain in an organic R-group in ligand L and the overall polarity of the molecule. The chain length can also affect whether the molecules of the liquid crystal assume a discotic or a calamitic structure. It is preferred that liquid crystal molecules have at least one property selected from: a permanent dipole moment; an anisotropic molecular polarizability; or are amphiphilic. Accordingly, to meet the first two requirements hereinabove that the complex can be applied as a mesomorphous film and that the film is at least metastable, a mesomorphous film can be formed if the R-group is long enough and the overall complex retains sufficient polarity. As is known to one of skill in the art, in general these two effects work against one another, viz: increasing the length of the alkyl chain tends to reduce the overall polarity of the molecule. For amphiphilic liquid crystal molecules, it is preferred that the molecules have at least one aliphatic chain attached to an ionic or polar moiety. The last requirement, that byproducts are easily removable, is, however, favored by shorter alkyl chains because the organic molecules formed as byproducts of the photochemical reaction must be driven off.

The ligands are those that meet the above criteria and consist of, or include, one or more functional groups selected from: alkoxy; alkyl; alkenyl; alkynyl; alicyclic; substituted alicyclic; alkyl bicyclic, such as norbornyl; phenyl; substituted phenyl; naphthyl, naphthylene; phenoxy; substituted phenoxy; carboxylate; substituted carboxylate; benzoate; substituted benzoate; and heterocyclic aromatic. Alkyl, alkenyl and alkynyl groups on a ligand can be straight-chain or branched and can comprise cis or trans isomers. Alkyl, alkenyl and alkynyl groups can also comprise double chains, i.e., a branched structure in which two long chains of similar length are present. Alkyl, alkenyl and alkynyl groups may also contain regions of conjugation, i.e., as indicated by alternating single and double or triple bonds. Ligands may also comprise conjugated chains of phenylene moieties, such as p-biphenylene. Groups such as alkyl, alkenyl, alkynyl, phenyl, phenylene may contain substituents such as alkoxy, halide, amino, nitro, cyanide, sulphono and sulphate groups.

Additionally, ligands may comprise one or more linking moieties, selected from the group consisting of: azo (—N=N—), diazo (—CN$^+$≡N—), oxy (—O—), amino (—N(R)—, wherein R is —H or —C$_{1-6}$), vinylene (—C=C—), phenylene (—C$_6$H$_4$—), substituted phenylene, oxime (—C=N—O—), carboxy (—C(=O)—O—), and imine (—C=N—).

Particularly favored are ligands derived from organic molecules that, in themselves, are able to form liquid crystals. In this regard, ligands derived from cholesteric molecules are suitable. Also particularly favored are ligands comprising so-called mesogenic groups that confer liquid crystalline properties upon, for example, polymer structures.

Ligands L can be mono-dentate, bi-dentate, chelating or bridge between 2 or more metal coordination centers. Preferred bidentate ligands include β-diketonato, mono-thio-β-diketonato, dithiolene, salicyladehyde, benzalazine, ethane-1,2-dithiolato, ethane-1,2,-dioximate and dithiocarboxylate. Bidentate ligands may also function as bridging ligands that bind to two metal centers. Ligands such as carboxylate may also function as bridging ligands in which each oxygen atom of the carboxylate group bonds to a different metal atom. In a preferred embodiment of the present invention, the metal complex is a dinuclear metal complex containing one or more carboxylate bridging ligands. Alternatively, a thioalkyl ligand can function as a bridging ligand by coordinating its sulfur atom directly to two metal centers, i.e., as a thiolato group. In the same way, a chloro ligand can bridge a pair of centers.

Ligands may also contain one or more chiral centers so that the overall metal complex can be chiral or can exist as one or more diastereomers. If the metal complex itself is chiral, it can be present in the film as a racemic mixture of enantiomers or as a substantially pure sample of a single enantiomer.

Ligands L should be such that metal complex 41 is small in order that there is not too much shrinkage of the film structure when ligands are driven off after photolysis. In general, where the material to be deposited is a metal, a metal oxide, or a metal sulphide the ligands should not include any organic groups comprising more than about 26 carbon atoms. If the ligands do not include any aryl groups such as phenyl, then the ligands preferably have 12 or fewer carbon atoms each. The metal atom can bond to a carbon, nitrogen, oxygen, sulfur or halogen atom on a ligand.

To enhance the desired photochemical characteristics, including the tendency of the products of the photochemical reaction to spontaneously thermally decompose, ligands from one or more of the following groups may be used in combination with the ligands listed above: oxalato; halogens; hydrogen; hydroxy; cyano; carbonyl, nitro; nitrito; nitrate; nitrosyl; ethylene; acetylenes; thiocyanato; isothiocyanato; aquo; azides; carbonato; amine; pyridinyl; and thiocarbonyl.

Azide groups are particularly useful as ligands for promoting the initiation of a photochemical reaction with many metals. Ethylene, acetylenes and aquo ($H_2O$) ligands are generally useful to cause the products of a photochemical reaction to be thermally unstable because these groups do not tightly bond to most metal atoms.

As it is desirable to apply metal complex 41 to substrate 44 by spin coating, it is preferable that metal complex 41 dissolve in and be stable with respect to a solvent suitable for use in spin coating. Many such solvents are known and, as is understood by one of skill in the art, the choice of preferred solvent will depend upon the metal complex in question. Some examples are methylene chloride, methyl isopropyl ketone, n-hexane, ethyl lactate, xylene, methyl isoamyl ketone, methyl-ethyl ketone and others familiar to one skilled in the art.

Metal complex 41 must also be stable in the sense that it will not rapidly and spontaneously decompose under process conditions. The stability of complexes of a given metal, M, generally depends upon the oxidation state of the metal in the complex. For example, Ni(0) complexes are generally unstable in air. Consequently, a process for depositing Ni based films, which includes processing steps in an air atmosphere, should include a Ni(II) complex in preference to a Ni(0) complex. Where metal complex 41 contains more than one metal atom, it is not a requirement that both atoms be in the same formal oxidation state as one another.

It is also consistent with the methods of the present invention that metal complex 41 can comprise a mixture of two or more complexes, or a mixture of isomers of a particular complex. For example, a particular complex may consist of a number of structural isomers, stereo-isomers, diastereoisomers or enantiomers. Additionally, it may be advantageous to deposit a patterned layer of metal alloy or mixed metal oxide. In which case metal complex 41 may comprise two or more metal complexes of different metal atoms.

Photochemistry

In order that byproducts of the photochemical reaction leave the film, at least one ligand must be reactive and be attached to complex 41 by a bond which is cleaved when the complex is raised to an excited state by the absorption of a photon. Preferably the reactive group is severed from the complex in a photochemical reaction initiated by ultraviolet light. To make the photochemical steps in the process efficient, it is highly preferable that the intermediate product produced when the reactive group is severed is unstable and spontaneously converts to the desired new material 70 and volatile byproducts.

There are several mechanisms by which a suitable photochemical reaction may occur. Some examples of suitable reaction mechanisms which may be exploited according to the invention are as follows: (a) absorption of a photon to place metal complex 41 in a ligand-to-metal charge transfer excited state in which a metal-ligand bond in the metal complex is unstable. The metal-ligand bond breaks and the remaining parts of metal complex 41 spontaneously decompose; (b) absorption of a photon to place metal complex 41 in a metal-to-ligand charge transfer excited state in which a metal-ligand bond in the metal complex is unstable. The metal-ligand bond breaks and the remaining parts of metal complex 41 spontaneously decompose; (c) absorption of a photon to place metal complex 41 in a d—d excited state in which a metal-ligand bond in the metal complex is unstable. The bond breaks and the remaining parts of metal complex 41 spontaneously decompose; (d) absorption of a photon to place metal complex 41 in an intramolecular charge transfer excited state in which a metal-ligand bond in the metal complex is unstable. The metal-ligand bond breaks and the remaining parts of the metal complex spontaneously decompose; (e) absorption of a photon to place at least one ligand of metal complex 41 in a localized ligand excited state. In the excited state a bond between the excited ligand and the metal complex is unstable and breaks. The remaining parts of the metal complex spontaneously decompose; (f) absorption of a photon to place metal complex 41 in an intramolecular charge transfer excited state such that at least one ligand of the metal complex is unstable and decomposes. After the ligand decomposes the remaining parts of the metal complex are unstable and spontaneously decompose; (g) absorption of a photon to place at least one ligand of metal complex 41 in a localized ligand excited state wherein the excited ligand is unstable and decomposes. After the ligand decomposes the remaining parts of metal complex 41 are unstable and spontaneously decompose; and (h) absorption of a photon to place metal complex 41 in a metal-to-ligand charge transfer excited state in which at least one ligand of metal complex 41 is unstable and decomposes. After the ligand decomposes the remaining parts of metal complex 41 are unstable and spontaneously decompose.

In its broad aspects the invention is not, however, limited to these reaction mechanisms.

EXAMPLES

Example 1

A silicon wafer substrate was mounted in a spin coater. The substrate may be held in place with a vacuum chuck such as is present in a commercial spin coater (e.g., from Headway or Laurell Corporation). A solution of the precursor, prepared from the complex $Re_2(O_2C_5H_9)_4Cl_2$ (0.009 g) dissolved in $CH_2Cl_2$ (1.0 ml) was dispens the silicon wafer while the substrate is spinning, resulting in the application of a thin film of the precursor metal complex on the surface. Films formed in this process were on the order of 100 nm thick. By adjusting the concentration of the solution and the spin speed the film thickness may be adjusted.

The film thus formed was shown to be a liquid crystal by an X-ray diffraction experiment which indicated a dominant layer spacing of 1.2 nm. Also prevalent was a broad peak in the region of 20 degrees (2θ) believed to be associated with the organic chains (similar peaks are observed in paraffin). The liquid crystal film appeared to be featureless upon examination with an optical microscope.

Similar results may be obtained with a variety of other Rhenium carboxylate complexes, whose general formula is $Re_2(O_2CR)_4Cl_2$ wherein R is a straight chain alkyl group. The structure of these compounds is thought to be a 'lantern' shape:

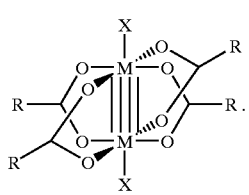

This is the structure that is believed to apply to metal carboxylates of the general formula: $M_2[O_2CR]_4X_2$ wherein M=Cu(II), Rh(II), Mo(II), Ru(II), and Cr(III); X=Cl, Br, $H_2O$; and R is an organic group. Structures and properties of these materials are described in M. A. S. Aquino, "Diruthenium and diosmium tetracarboxylates: synthesis, physical properties and applications", *Coord. Chem. Rev.*, (1998) 170:141–202.

In this depiction the bond between the two metal atoms need not be formally a quadruple bond but may have some other order. Metal-metal bonds are described further in *Multiple Bonds Between Metal Atoms*, F. A. Cotton and R. A. Walton, Clarendon Press, Oxford, (1993).

Structures of this nature have been reported for complexes in which the metal atom is Cu, Rh, Ru, Mo, Cr and W. When the metal is Cu, it is believed that these structures form a hexagonal columnar mesophase for longer alkyl chains and a rectangular columnar mesophase for the shorter alkyl chains. For other metals, a number of different ordered and disordered columnar mesophases are understood to arise. In the rhenium complexes of this example there is believed to be a covalent bond between the two rhenium atoms but for the isostructural complexes of other metals there need not be such a bond between the two metal atoms.

In Table 1 the appropriate parameters describing the liquid crystal structure are summarized. In Table 1, for each metal complex, the d-spacing associated with a family of diffraction peaks, is presented. For the complexes with alkyl chains of 4 carbon atoms and longer, two families of peaks may be observed. These families can correspond to two different structures or two orientations of the same structure. In assigning an index to the planes, the choice is to some extent arbitrary. The (001) planes are those orthogonal to the C-direction which is itself perpendicular to the plane of the film.

TABLE 1

Lattice spacing observed for liquid crystal systems formed by spin coating.

| Precursor | Diffraction peaks/2θ[a] (intensity) | d-spacing/ Å[b] | index |
|---|---|---|---|
| $Re_2(O_2CC_2H_5)_4Cl_2$ | 10.60 (50), 13.17 (100) | 8.78 | |
| $Re_2(O_2CC_3H_7)_4Cl_2$ | 11.45 (100) | 8.8 | |
| $Re_2(O_2CC_4H_9)_4Cl_2$ | 7.61 (100), 14.8 (27), 22.5 (5); | 11.8 | (001); c = 12 |
| $Re_2(O_2CC_5H_{11})_4Cl_2$ | 5.85 (100), 11.6 (34), 17.6 (13); | 15.1 | (001); c = 15 |
| $Re_2(O_2CC_6H_{13})_4Cl_2$ | 5.31 (100), 10.50 (29), 17.62(11); | 16.2 | (001); c = 16.8 |

[a]instrument uncertainty = 0.05°
[b]average spacing

The film of $Re_2(O_2CC_5H_9)_4Cl_2$, upon photolysis for 24 hours with the output (4.94 mW/cm²) of a low pressure mercury lamp underwent a chemical reaction resulting in the formation of rhenium oxide. In the presence of ambient air, a byproduct (believed to be a partially hydrated material) was also formed. Depending upon conditions the oxide formed was contaminated with some chlorine.

The films prepared in this way were characterized by Auger electron spectroscopy. Similar results were found with the other precursor complexes and are summarized in Table 2.

TABLE 2

Surface analysis of films formed by different rhenium carboxylate precursors by Auger electron Spectroscopy (error approximately 20 atom %[a])

| Complex | Sputter time (sec) | % Re | % O | % C |
|---|---|---|---|---|
| $Re_2(O_2CC_2H_5)_4Cl_2$ | 0 | 25 (±5.0) | 42 (±8.4) | 33 (±6.6) |
| | 10 | 35 (±7.0) | 42 (±8.4) | 24 (±4.8) |
| | 20 | 42 (±8.4) | 58 (±12.0) | 0 |
| $Re_2(O_2CC_3H_7)_4Cl_2$ | 0 | 27 (±5.4) | 51 (±10) | 22 (±4.4) |
| | 10 | 30 (±6.0) | 70 (±14) | 0 |
| | 20 | 41 (±8.2) | 59 (±12) | 0 |
| $Re_2(O_2CC_4H_9)_4Cl_2$ | 0 | 20 (±4.0) | 54 (±11) | 26 (±5.2) |
| | 10 | 34 (±6.8) | 66 (±13) | 0 |
| | 20 | 49 (±9.8) | 51 (±10) | 0 |
| $Re_2(O_2CC_5H_{11})_4Cl_2$ | 0 | 26 (±5.2) | 52 (±10) | 22 (±4.4) |
| | 10 | 42 (±8.4) | 58 (±12) | 0 |
| | 20 | 47 (±9.4) | 53 (±11) | 0 |
| $Re_2(O_2CC_6H_{13})_4Cl_2$ | 0 | 18 (±3.6) | 56 (±11) | 26 (±5.2) |
| | 10 | 46 (±9.2) | 54 (±11) | 0 |
| | 20 | 39 (±7.8) | 61 (±12) | 0 |
| $Re_2(O_2CC_7H_{15})_4Cl_2$ | 0 | 19 (±3.8) | 49 (±9.8) | 32 (±6.4) |
| | 10 | 43 (±8.6) | 57 (±11) | 0 |
| | 20 | 48 (±9.6) | 52 (±10) | 0 |

[a]Davis, L. E., MacDonald, N. C.; Palmberg, P. W.; Riach, G. E. and Weber, R. E.; Handbook of Auger Electron Spectroscopy: A reference book of standard data for identification and interpretation of Auger Electron Spectroscopy Data, 2nd Ed., Eden Prairie, MN: Physical Electronics Division Perkin-Elmer Corp. 1976. p 12.

Figure 6:
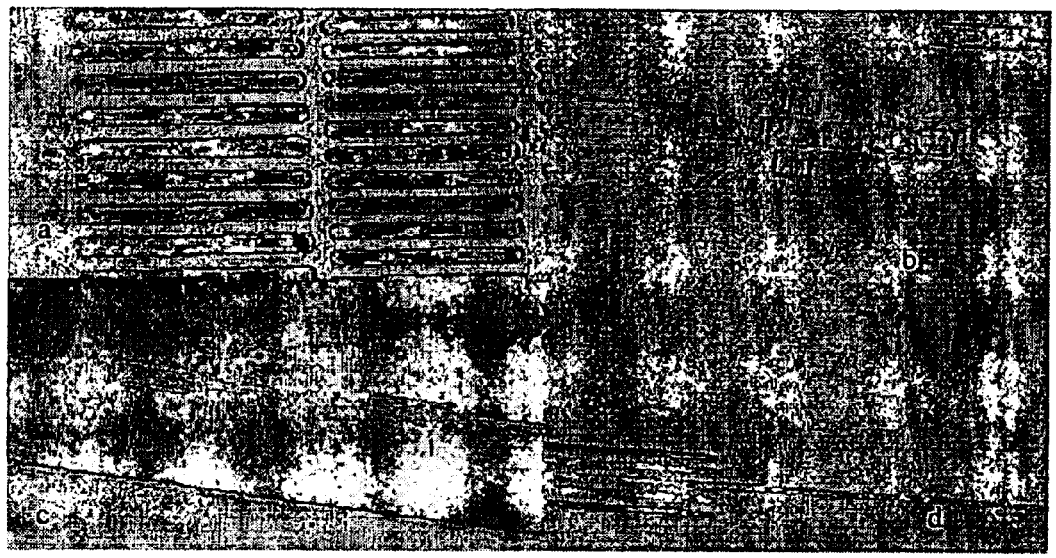
FIG. 6 shows patterns generated by lithographic deposition of rhenium oxide from $Re_2(O_2C_5H_{11})_4$. In a) a series of lines deposited over an area of 40×50 µm is shown. In b) a pattern in a 400 by 500 µm area in shown. In c) a series of lines and spaces prior to rinsing (area 200×250 µm and in d) a similar series after the unreacted material is removed (area 40 ×50 µm).

In a similar experiment a film of $Re_2(O_2C_5H_9)_4Cl_2$ was applied and then photolyzed through a lithography mask. The resultant film was rinsed with $CH_2Cl_2$/petroleum ether and a henium oxide pattern remained on the surface. See FIG. 6.

Using a lithography mask, the dose of radiation required to print data was recorded on these materials and is given in Table 3.

TABLE 3

The doses to print for different precursor films using light of wavelength 254 nm and an intensity of 4.94 mW/cm².

| Compound | Dose (J/cm²) |
|---|---|
| $Re_2(O_2CC_2H_5)_4Cl_2$ | 40.2 |
| $Re_2(O_2CC_3H_7)_4Cl_2$ | 49.2 |
| $Re_2(O_2CC_4H_9)_4Cl_2$ | 48.2 |
| $Re_2(O_2CC_5H_{11})_4Cl_2$ | 17.26 |
| $Re_2(O_2CC_6H_{13})_4Cl_2$ | 17.12 |
| $Re_2(O_2CC_7H_{15})_4Cl_2$ | 36.81 |

In one experiment a film of $Re_2(O_2C_5H_9)_4Cl_2$ was photolyzed with ultraviolet light (254 nm) The progress of the reaction could be monitored by Fourier transform infrared spectroscopy. Following exhaustive photolysis the conductivity of the film was measured. The films were found to be conductive.

The X-ray diffraction of the films was also monitored. The initial films varied in their structure but in many cases gave a diffraction pattern consistent with the formation of a layered ordered film. The photolysis of the films resulted in a change in the diffraction to one consistent with an oriented film of ReO$_3$. The X-ray diffraction confirmed the formation of primarily oriented rhenium oxide. This material was found to be conducting. This process was repeated with a variety of rhenium ligand complexes such as Re$_2$(O$_2$CR)$_4$Cl$_2$, where O$_2$CR is taken from the group consisting of butanoate, pentanoate, propanoate, hexanoate, heptanoate, benzoate and ethoxybenzoate.

Example 2

In a separate example, a 1:1 mixture of two precursors Re$_2$(O$_2$C$_7$H$_{15}$)$_4$Cl$_2$ and Re$_2$(O$_2$C$_5$H$_{11}$)Cl$_2$ were applied together to form a film. This film was photolyzed to form a conductive rhenium based film.

Example 3

This example demonstrates the deposition of copper oxide from a copper carboxylate.

A film of copper(II) heptanoate was coated onto a silicon surface from a heptane solution. It formed an optical quality thin film. This film showed an X-ray pattern characteristic of a d-spacing of 18 Å. FTIR showed the asymmetric vibration of carboxylate at 1588 cm$^{-1}$. Photolysis at room temperature under 254 nm light indicates complete reaction (indicated by loss of the carboxylate absorption band) after 1 hour of exposure. Auger analysis confirmed that copper oxide was deposited on the surface.

The copper(II) heptanoate compound has been described to have mesomorphic properties (Ibn-Elhaj, M.; Guillon, D.; Skoulios, A.; Girod-Godquin, A. M.; and Maldivi,P. Liquid Crystals. 1992, 11(5), 731). There is a transition from the lamellar to the columnar mesophase at 92° C.

It is also noted that similar complexes of Copper are known to form amorphous films and can also be used in the photochemical deposition of copper oxide onto a substrate. (See, R. H. Hill, A. A. Avey, S. L. Blair, M. Gao, B. J. Palmer, "Molecular Design for Photo and Electron Beam Lithography with Thin Films of Coordination Compounds" Mater. Chem. and Physics, (1996), 43, 233–237; A. A. Avey and R. H. Hill "Solid State Photochemistry of Cu$_2$(OH$_2$)$_2$(O$_2$C(CH$_2$)$_4$CH$_3$)$_4$ in Thin Films: The Photochemical Formation of High Quality Films of Copper and Copper (I) Oxide. Demonstration of a Novel Lithographic Technique for the Patterning of Copper" J. Am. Chem. Soc., (1996), 118, p.237; R. H. Hill, A. A. Avey, S. L. Blair, M. Gao, B. J. Palmer, "Photo and Electron Beam Lithography with Coordination Compounds", IUMRS-ICEM'94 Symp. Proc. (1995), Vol 1, 435–440.)

As will be apparent to those skilled in the art in the light of the foregoing disclosure, many alterations and modifications are possible in the practice of this invention without departing from the spirit or scope thereof. For example, the processes described above use opaque masks to block light from portions of a film being patterned. Any method for selectively irradiating portions of a film being patterned while leaving other areas non-irradiated also comes within the scope of the invention. Some examples of such methods include direct laser writing, contact masking and projection printing.

The processes described above have used spin coating to apply films of metal complexes for practicing the invention. The ability to create suitable films by using commonly available spin coating equipment is important and adds to the commercial value of the invention. However, other methods of applying films of metal complexes come within the broad scope of the invention. Such methods include dip-coating, spraying, and other methods of applying mesomorphous films of metal complexes on a substrate. This disclosure has described processes in which light is used to trigger photochemical reactions in a metal complex which yield a metal or a metal containing material. The frequency of the radiation required depends primarily upon the metal complex in question. Visible, infrared, and ultraviolet light may be used with suitable metal complexes to practice the invention. Other triggers, such as electron beams, ion beams or atom beams, may also be used to practice the invention if they are able to populate the desired excited state (i.e., if they raise the precursor metal complex to an energy state from which it can decompose by the path of the desired photochemical reaction).

The methods of the invention may be combined in various ways with other prior art techniques. For example, a film of metal complex 41 may be applied to a substrate according to the present invention and then a first portion of the film may be converted to a first metal-containing material, such as a metal, by exposure to a focused ion or electron beam according to prior art methods. Subsequently, portions of the film adjacent to the first metal-containing material may be converted to a second metal-containing material, such as a metal oxide, by the methods of the invention, as described above. The resulting structure is planar and utilizes the high resolution of the electron beam to accurately define the area of first new material. Accordingly, the scope of the invention is to be construed in accordance with the substance defined by the following claims.

What is claimed is:

1. A method for making a pattern of a metal containing material on a substrate, said method comprising:

(a) applying a mesomorphous film of a metal complex on a surface of the substrate;

(b) exposing, in a first atmosphere, a first area, having a first shape, of said film to electromagnetic radiation from a first source to cause said metal complex in said first area to undergo a first photo-chemical reaction, said first photochemical reaction transforming said metal complex in said first area into a first metal containing material adherent to said substrate and one or more ligand byproducts of a first kind at least some proportion of which are driven off during the course of said first photochemical reaction, wherein the pattern comprises said first shape; and (c) driving off an unreacted amount of said metal complex and, where present, a remainder of said one or more ligand byproducts of a first kind that are not driven off during the course of said first photochemical reaction.

2. The method of claim 1 further comprising:

after said exposing, and before said driving off, (d) exposing, in a second atmosphere, a second area, having a second shape, of said film to electromagnetic radiation from a second source to cause said metal complex in said second area to undergo a second photo-chemical reaction, said second photochemical reaction transforming said metal complex in said second area into a second metal containing material adherent to said substrate and one or more ligand byproducts of a second kind at least some proportion of which are driven off during the course of said second photochemical reaction, wherein the pattern additionally comprises said second shape; and (e) driving off, where present, a remainder of said one or more ligand byproducts of a second kind that are not driven off during the course of said second photochemical reaction.

3. The method of claim 2 wherein said first area is adjacent to said second area and said first and second metal containing materials form a planar structure on said substrate.

4. The method of claim 2 wherein said steps of exposing said first and second areas of said film to electromagnetic radiation from said first and second sources respectively, comprise aligning first and second masks over said substrate and illuminating a surface of said first mask away from said substrate with said electromagnetic radiation from a first source, and illuminating a surface of said second mask away from said substrate with said electromagnetic radiation from a second source.

5. The method of claim 2 wherein at least one of said electromagnetic radiation from a first source, and said electromagnetic radiation from a second source comprises ultraviolet light.

6. The method of claim 2 wherein said first atmosphere comprises oxygen and said first metal containing material is a metal oxide.

7. The method of claim 1 wherein said first atmosphere comprises oxygen and said first metal containing material is a metal oxide.

8. The method of claim 7 wherein said first atmosphere is air.

9. The method of claim 7 further comprising:
removing remaining metal complex from said substrate, after said exposing said first area of said film to said electromagnetic radiation from a first source.

10. The method of claim 7 further comprising the step of reacting said metal oxide with a suitable chemical in a suitable atmosphere to reduce said metal oxide to a metal adherent to said substrate.

11. The method of claim 1 wherein a local temperature of said first metal containing material is maintained below an annealing temperature of said first metal containing material throughout said step of exposing said first area of said film to electromagnetic radiation from a first source.

12. The method of claim 11 wherein said local temperature is maintained below 320° C.

13. The method of claim 1 wherein said exposing said first area of said film to electromagnetic radiation comprises aligning a first mask over said substrate and illuminating a surface of said mask away from said substrate with said electromagnetic radiation from a first source.

14. The method of claim 13 wherein said electromagnetic radiation from a first source comprises ultraviolet light.

15. The method of claim 1 wherein said metal complex comprises one or more metal atoms bonded to one or more ligands, at least one of said one or more ligands is bonded to said metal complex by a chemical bond which is broken by the absorption of said electromagnetic radiation from a first source, and wherein said complex is unstable when said at least one ligand is removed.

16. The method of claim 15 wherein said at least one ligand comprises a carboxylate group.

17. The method of claim 15 wherein at least one of said ligands is selected from the group consisting of: oxalato; halogens; hydrogen; hydroxy; cyano; carbonyl, nitro; nitrito; nitrate; nitrosyl; ethylene; acetylenes; thiocyanato; isothiocyanato; aquo; azides; carbonato; amine; pyridinyl; and thiocarbonyl.

18. The method of claim 15 wherein at least one of said ligands is selected from the group consisting of: alkoxy; alkyl; alkenyl; alkynyl; alicyclic; substituted alicyclic; alkyl bicyclic; phenyl; substituted phenyl; naphthyl, naphthylene; phenoxy; substituted phenoxy; carboxylate; substituted carboxylate; benzoate; substituted benzoate; and heterocyclic aromatic.

19. The method of claim 18 wherein any of said ligands that comprises one or more aryl groups does not comprise more than 26 carbon atoms.

20. The method of claim 18 wherein any of said ligands that does not comprise any aryl groups does not comprise more than 12 carbon atoms.

21. The method of 20 wherein said at least one ligand has formula $O_2CR$ wherein R is an organic group selected from the group consisting of alkyl, alkene and alkyne.

22. The method of claim 21 wherein R is $(CH_2)_4CH_3$.

23. The method of claim 17 wherein at least one of said ligands is a bidentate ligand selected from the group consisting of: β-diketonato, mono-thio-β-diketonato, dithiolene, salicyladehyde, benzalazine, ethane-1,2-dithiolato, ethane-1,2,-dioximate, and dithiocarboxylate.

24. The method of claim 17 wherein at least one of said ligands comprises one or more linking moieties, selected from the group consisting of: azo, diazo, oxy, amino, vinylene, phenylene, substituted phenylene, oxime, carboxy, and imine.

25. The method of claim 1 wherein said metal complex comprises two metal atoms bonded to one another.

26. The method of claim 15 wherein at least one of said metal atoms is selected from the group consisting of: copper, nickel, platinum, palladium, ruthenium, rhenium, molybdenum, chromium, tungsten and iron.

27. The method of claim 15 wherein at least one of said metal atoms is selected from the group consisting of: lead, mercury, tin, silicon and germanium.

28. The method of claim 15 wherein at least one of said metal atoms is selected from the group consisting of: rhenium and ruthenium.

29. The method of claim 15 wherein said absorption of said electromagnetic radiation from a first source places said metal complex in a ligand to metal charge transfer excited state in which a metal to ligand bond in said metal complex is unstable.

30. The method of claim 15 wherein said absorption of said electromagnetic radiation from a first source places said metal complex in a metal to ligand charge transfer excited state in which a metal to ligand bond in said metal complex is unstable.

31. The method of claim 15 wherein said absorption of said electromagnetic radiation from a first source places said metal complex in a d—d excited state such that a metal to ligand bond in said metal complex is unstable.

32. The method of claim 15 wherein said absorption of said electromagnetic radiation from a first source places said metal complex in an intramolecular charge transfer excited state such that a metal to ligand bond in said complex is unstable.

33. The method of claim 15 wherein said absorption of said electromagnetic radiation from a first source places at least one of said ligands in a localized ligand excited state wherein a bond between said excited ligand and said metal complex is unstable.

34. The method of claim 1 wherein said exposing of said film to said electromagnetic radiation from a first source places said metal complex in an intramolecular charge transfer excited state such that at least one of said at least one ligands is unstable and decomposes.

35. The method of claim 1 wherein said exposing of said film to said electromagnetic radiation from a first source places at least one of said ligands in a localized ligand excited state wherein said excited ligand is unstable and decomposes.

36. The method of claim 1 wherein said exposing of said film to said electromagnetic radiation from a first source places said metal complex in a metal to ligand charge transfer excited state such that at least one of said at least one ligands is unstable and decomposes.

37. The method of claim 1 wherein said exposing of said film to said electromagnetic radiation from a first source places said metal complex in a ligand to metal charge transfer excited state such that at least one of said at least one ligands is unstable and decomposes.

38. The method of claim 1 additionally comprising repeating said applying, said exposing and said driving off for a second metal complex.

39. The method of claim 38 wherein said second metal complex is applied on top of said first metal containing material.

40. The method of claim 38 wherein said second metal complex is applied directly to said substrate.

41. A method for making patterned metal containing material on a substrate, said method comprising:
   (a) applying a mesomorphous film of a metal complex on a surface of the substrate;
   (b) exposing, in a first atmosphere, a first area, having a first shape, of said film to a particle beam to cause said metal complex in said first area to undergo a transformation into a first metal-containing material adherent to said substrate and one or more ligand byproducts of a first kind at least some proportion of which are driven off during the course of said transformation;
   (c) driving off, where present, a remainder of said one or more ligand byproducts of a first kind that are not driven off during the course of said transformation;
   (d) exposing, in a second atmosphere, a second area of said film, having a second shape, adjacent to said first area, to electromagnetic radiation of a wavelength suitable to cause said metal complex in said second area to undergo a photo-chemical reaction, said reaction transforming said metal complex in said second area into a second metal containing material adherent to said substrate and one or more ligand byproducts of a second kind at least some proportion of which are driven off during the course of said photochemical reaction; and
   (e) driving off an unreacted amount of said metal complex and, where present, a remainder of said one or more ligand byproducts of a second kind that are not driven off during the course of said photochemical reaction.

42. The method of claim 41 wherein said particle beam is selected from a group consisting of an electron beam and an ion beam.

* * * * *